United States Patent
Jung et al.

(10) Patent No.: US 9,136,119 B2
(45) Date of Patent: Sep. 15, 2015

(54) NON-POLAR SUBSTRATE HAVING HETERO-STRUCTURE AND METHOD FOR MANUFACTURING THE SAME, AND NITRIDE-BASED LIGHT EMITTING DEVICE USING THE SAME

(75) Inventors: Sukkoo Jung, Seoul (KR); Younghak Chang, Seoul (KR); Hyunggu Kim, Seoul (KR); Kyuhyun Bang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 113 days.

(21) Appl. No.: 13/517,785

(22) Filed: Jun. 14, 2012

(65) Prior Publication Data

US 2013/0009182 A1    Jan. 10, 2013

(30) Foreign Application Priority Data

Jul. 5, 2011    (KR) .......................... 10-2011-0066326

(51) Int. Cl.

| | | |
|---|---|---|
| *H01L 29/15* | (2006.01) | |
| *H01L 21/02* | (2006.01) | |
| *H01L 33/00* | (2010.01) | |
| *H01L 33/02* | (2010.01) | |
| *H01L 21/8258* | (2006.01) | |
| *H01L 33/20* | (2010.01) | |

(52) U.S. Cl.
CPC ...... *H01L 21/02639* (2013.01); *H01L 21/0242* (2013.01); *H01L 21/0254* (2013.01); *H01L 21/0265* (2013.01); *H01L 21/02433* (2013.01); *H01L 21/02458* (2013.01); *H01L 21/02505* (2013.01); *H01L 21/8258* (2013.01); *H01L 33/007* (2013.01); *H01L 33/02* (2013.01); *H01L 33/20* (2013.01)

(58) Field of Classification Search
CPC .................... H01L 21/0241; H01L 21/02433; H01L 21/02458; H01L 21/02505; H01L 21/0254; H01L 21/0265; H01L 21/02639; H01L 21/02647; H01L 33/007; H01L 33/02; H01L 33/20; H01L 21/0242
USPC .......................................... 257/76, 103, 615
See application file for complete search history.

(56) References Cited

U.S. PATENT DOCUMENTS

| | | | | |
|---|---|---|---|---|
| 2001/0053618 | A1* | 12/2001 | Kozaki et al. | 438/933 |
| 2005/0156175 | A1* | 7/2005 | Kim | 257/77 |
| 2006/0084245 | A1* | 4/2006 | Kohda | 438/478 |
| 2010/0096615 | A1* | 4/2010 | Okamoto et al. | 257/13 |
| 2010/0140745 | A1* | 6/2010 | Khan et al. | 257/615 |
| 2010/0314717 | A1* | 12/2010 | Sakai | 257/615 |
| 2011/0278585 | A1* | 11/2011 | Haskell et al. | 257/76 |
| 2012/0258286 | A1* | 10/2012 | Amano et al. | 428/162 |

FOREIGN PATENT DOCUMENTS

| | | |
|---|---|---|
| KR | 10-2004-0067705 A | 7/2004 |
| KR | 10-2005-0075054 A | 7/2005 |
| KR | 10-2007-0055194 A | 5/2007 |

\* cited by examiner

*Primary Examiner* — Benjamin Sandvik
*Assistant Examiner* — Farid Khan
(74) *Attorney, Agent, or Firm* — KED & Associates, LLP

(57) ABSTRACT

Disclosed are a non-polar hetero substrate, a method for manufacturing the same, and a nitride-based light emitting device using the same. The non-polar hetero substrate includes a non-polar base substrate, a nitride base layer disposed on the substrate, a defect reduction layer disposed on the nitride base layer, the defect reduction layer including a plurality of air gaps, and a nitride semiconductor layer disposed on the defect reduction layer.

10 Claims, 19 Drawing Sheets

NON-POLAR SUBSTRATE HAVING HETERO-STRUCTURE AND METHOD FOR MANUFACTURING THE SAME, AND NITRIDE-BASED LIGHT EMITTING DEVICE USING THE SAME

This application claims the benefit of Korean Patent Application No. 10-2011-0066326, filed on Jul. 5, 2011, which is hereby incorporated by reference as if fully set forth herein.

BACKGROUND OF THE INVENTION

1. Field of the Invention

The present invention relates to a substrate and semiconductor light emitting device. More specifically, the present invention relates to a non-polar hetero substrate, a method for manufacturing the same, and a nitride-based light emitting device using the same.

2. Discussion of the Related Art

Gallium nitride used as a material for semiconductor devices such as blue light emitting diodes has a Wurzite crystal structure, which is mostly grown into a thin film in a c-surface crystal direction. The reason is that crystal growth in the c-surface crystal direction facilitates horizontal growth and high-quality thin films with little defects (such as dislocation) can be obtained.

At this time, a crystal structure in which nitrogen layers and gallium layers repeatedly cross each other based on growth direction is present. Accordingly, strong internal field is present between nitrogen and gallium, thus causing a polarization phenomenon.

The formed internal field is divided into two components, spontaneous polarization and piezo-electric field. When layers having different lattice constants such as InAlGaN are inserted, polarization effects increase and quantum confined stark effects may occur.

For example, in a structure in which an InAlGaN active layer is inserted between p- and n-type GaN layers, such as blue light emitting diode, deformation between layers is caused by the difference in lattice constant. This causes generation of internal field and bending of an energy bend structure of the active layer.

As a result, wave functions of electrons and holes in the active layer are sparially separated and the size of energy gap decreases, which may be main factors of deterioration in recombination efficiency.

SUMMARY OF THE INVENTION

Accordingly, the present invention is directed to a non-polar hetero substrate, a method for manufacturing the same, and a nitride-based light emitting device using the same that substantially obviate one or more problems due to limitations and disadvantages of the related art.

It is one object of the present invention to provide a non-polar hetero substrate that minimizes formation of crystal defects which occurs in the process of growing hetero-thin films and exhibits superior surface evenness, a method for manufacturing the same, and a nitride-based light emitting device using the same.

It is another object of the present invention to provide a non-polar hetero substrate in which light emission in the surface direction of the light emitting diode is facilitated and light extraction efficiency is thus improved by inserting an air gap with a predetermined shape and size, a method for manufacturing the same, and a nitride-based light emitting device using the same.

It is yet another object of the present invention to provide a nitride-based light emitting device wherein separation and removal of a device structure, in which a hetero-substrate is divided, are easy, and yield and process cost are thus improved, in the manufacturing of a non-polar nitride-based light emitting device using the hetero-substrate.

In accordance with one aspect of the present invention, provided is a non-polar hetero substrate, including: a non-polar base substrate; a nitride base layer disposed on the substrate; a defect reduction layer disposed on the nitride base layer, the defect reduction layer including a plurality of air gaps; and a nitride semiconductor layer disposed on the defect reduction layer.

In accordance with another aspect of the present invention, provided is a non-polar nitride-based light emitting device, including: a hetero-substrate including a defect reduction layer including a plurality of air gaps; a first conductive semiconductor layer disposed on the hetero-substrate; an active layer disposed on the first conductive semiconductor layer; a second conductive semiconductor layer disposed on the active layer; a first electrode electrically connected to the first conductive semiconductor layer; and a second electrode electrically connected to the second conductive semiconductor layer.

In accordance with another aspect of the present invention, provided is a method for manufacturing a non-polar hetero-substrate, including: growing a nitride base layer on a non-polar substrate; forming a mask layer having a plurality of unit structures on the nitride base layer, wherein the distance between the unit structures is substantially uniform; and forming a nitride semiconductor layer on the mask layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Reference will now be made in detail to the specific embodiments of the present invention, examples of which are illustrated in the accompanying drawings.

However, the present invention allows various modifications and variations and specific embodiments thereof are described in drawings and will be described in detail. The present invention should not be construed as limited to the embodiments set forth herein and includes modifications, variations, equivalents, and substitutions compliant with the spirit or scope of the present invention defined by the appended claims.

It will be understood that when an element such as a layer, area, or substrate is referred to as being "on" another element, it can be directly on the element, or one or more intervening elements may also be present.

Also, it will be understood that although terms such as "first" and "second" may be used herein to describe elements, components, areas, layers and/or regions, the elements, components, areas, layers and/or regions should not be limited by these terms.

Non-polar gallium nitride (non-polar GaN) means a crystal material in which a polarization phenomenon is not present in a growth direction, which can be realized by growing in a direction that rotates 90 degrees with respect to the c-surface, the upper surface of a hexagonal system. In this case, based on growth direction, the number of a nitrogen (N) layer is equivalent to that of a gallium (Ga) layer, thus offsetting an internal field in a growth direction and causing no polarization.

Accordingly, non-polar gallium nitride is free of distortion of energy band of piezoelectric polarization having a common c-surface gallium nitride and advantageously solves a problem such as decrease in recombination efficiency of electrons and holes in the active layer.

In addition, unlike a c-surface gallium nitride material in which design of an active layer with a thickness lower than a predetermined level is limited, non-polar gallium nitride can greatly reduce the thickness limitation and can design an active layer suitable for high current driving. To date, in thin film growth of non-polar gallium nitride using such a hetero-substrate, growth of a-surface gallium nitride on an r-surface sapphire substrate is generally used.

Figure 1:
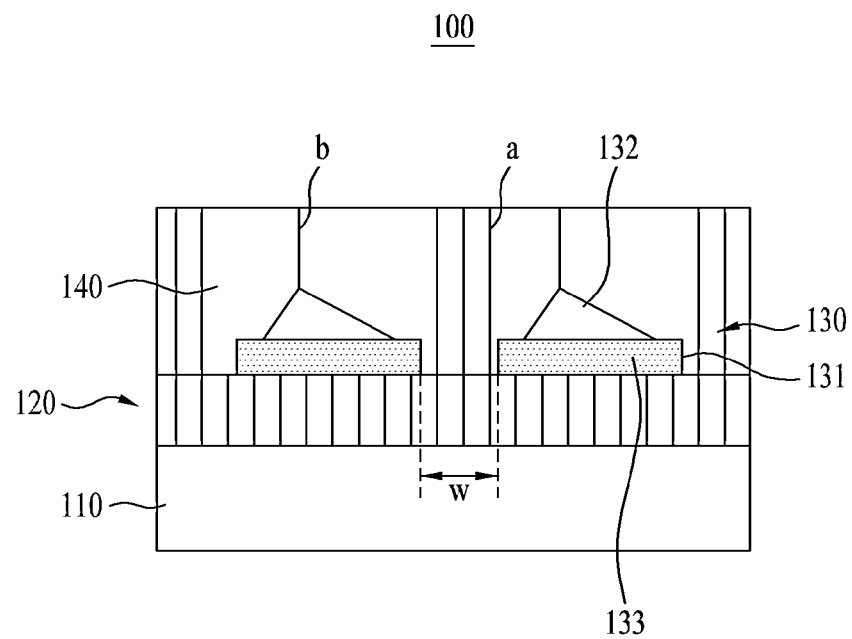
FIG. 1 is a sectional view illustrating an example of a non-polar hetero substrate.

As shown in FIG. 1, a non-polar hetero-substrate 100 includes a non-polar base substrate 110 and a nitride base layer 120 disposed thereon. The non-polar base substrate 110 may use an r-surface ([1-102] surface) sapphire substrate. Other non-polar substrates may be used.

Figure 2:
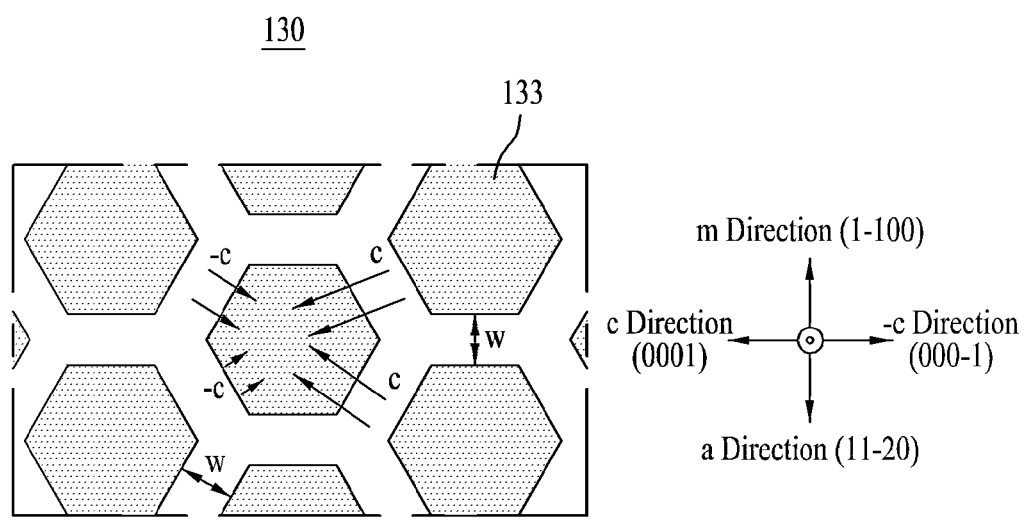
FIG. 2 is a schematic view illustrating a shape and grow process of a mask layer pattern.

A defect reduction layer 130 is disposed on the nitride base layer 120 and the defect reduction layer 130 includes a plurality of unit structures 133, each including a dielectric, as shown in FIG. 2. It is beneficial that the unit structures 133 have a polygon shape and the width (w) between the unit structures 133 is substantially uniform.

As such, when a nitride semiconductor layer 140 is grown in a state in which the defect reduction layer 130 is disposed, as shown in FIG. 2, nitride semiconductor crystals are grown in a horizontal direction such as c-direction ([0001] direction) and −c direction ([000-1] direction), and c direction growth is superior.

That is, lateral surface growth has an anisotropic property that is determined by a-surface gallium nitride crystal direction. Regarding the basic principle of growth, lateral surface direction growth does almost not occur in an m direction and occurs based on the c direction.

In particular, for the c direction, rapid lateral surface growth occurs in a +c direction and relatively slow growth occurs in the −c direction.

That is, non-polar gallium nitride-based hetero thin film growth has an anisotropic thin film growth property in a planar direction and, in particular, has a priority of growth in the c-surface direction, unlike c-surface gallium nitride having an isotropic growth property in the planar direction.

Accordingly, it is not easy to grow gallium nitride layer with little defects and high qualities, and realize thin films having a flat surface property. Generally, defects such as dislocation may be caused by mismatch in lattice constant and difference in thermal expansion coefficient between hetero-substrate such as sapphire and the gallium nitride-based material.

Such a defect can be effectively reduced by the defect reduction layer 130 and, as a result, qualities and light extraction efficiency of nitride semiconductor layer can be greatly improved.

When nitride semiconductor crystals are grown to form a nitride semiconductor layer 140, a nitride semiconductor is grown along the outline 131 of the unit structure 133 and meets the nitride semiconductor layer 140, and an air gap 132 is disposed on the unit structure 133.

That is, in the growth process of nitride semiconductor, due to great difference between horizontal direction growth speed and vertical direction growth speed, an empty area having a substantially pyramidal shape having an inclined surface is formed in the upper region of the dielectric constituting the unit structure 133. This area constitutes the air gap 132.

Accordingly, this air gap 132 has a refractive index of an air, thus advantageously improving light extraction efficiency, when a light emitting diode structure is formed on the hetero-substrate 100 having the air gap 132.

An inclination angle of the empty area, in which the air gap 132 is formed, that is generated during the sealing process of nitride semiconductor depends on the difference between horizontal direction growth speed and vertical direction growth speed, and can be designed by changing growth conditions.

The nitride semiconductor layer having an a-surface crystal direction can be formed by a method such as metal-organic chemical vapor deposition (MOCVD), molecular beam epitaxy (MBE), or hydride vapor phase epitaxy (HVPE) and, in this embodiment, the nitride semiconductor layer is realized by MOCVD.

A sapphire substrate is used as the base substrate 110 and the nitride base layer 120 may be formed by the following method.

First, a gallium nitride nuclear layer is grown on a sapphire substrate, and a gallium nitride layer having a three-dimensional growth mode having a higher growth speed in a vertical direction is then grown.

Next, the gallium nitride layer is grown in a two-dimensional growth mode in which growth speed in a horizontal direction is relatively high, a plurality of progression directions in the generated dislocations is bent in a vertical direction, and dislocation propagated to the surface is thus reduced to form a non-polar nitride base layer 120 in which the defect density is primarily reduced.

A silicon oxide film with a thickness of 10 to 1000 nm is deposited as a mask layer on the prepared nitride base layer 120 and a pattern having a specific shape separated by a uniform distance is formed. The deposition of silicon oxide film is carried out using a method such as plasma enhanced chemical vapor deposition (PECVD) or sputtering.

The progression of the lateral growth is characterized in that characteristics of a-surface gallium nitride are changed at respective crystal directions. The gallium nitride layer of the three-dimensional growth mode may have a thickness of 10 to 3000 nm and the gallium nitride layer of the two-dimensional growth mode may have a thickness of 1000 to 5000 nm.

Figure 3:
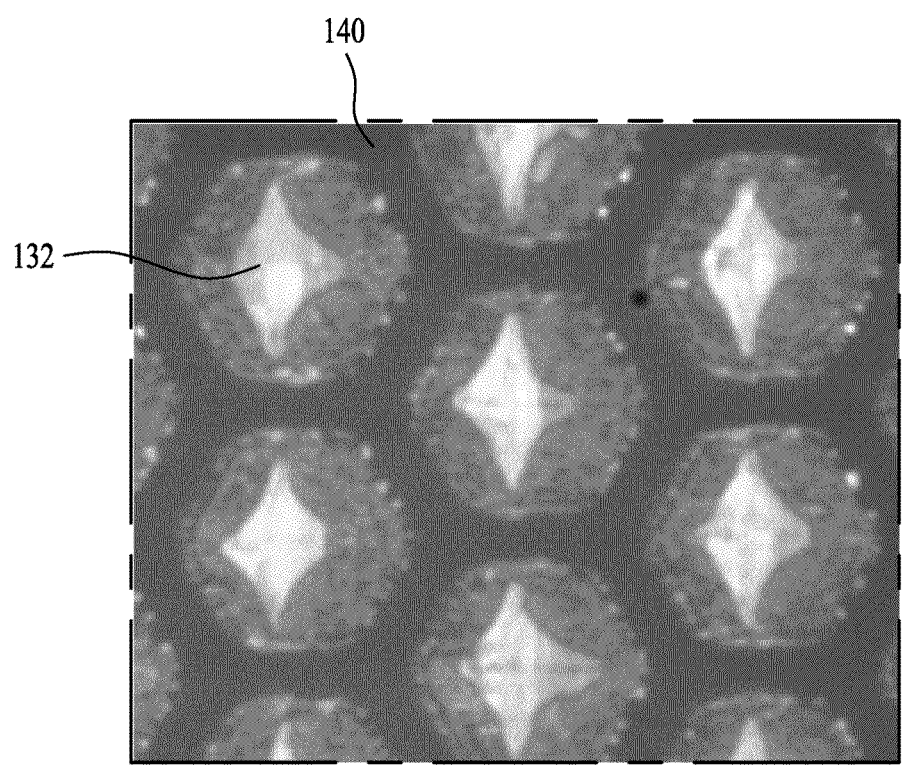
FIG. 3 is a microscopic image of a hetero-substrate.

FIG. 3 is a microscopic image illustrating the shape of air gap 132 formed during this process. That is, the air gaps 132 are regularly arranged and disposed together with the unit structures 133 in the defect reduction layer 130. Accordingly, an average distance between the air gaps 132 may be substantially uniform.

As can be seen from the embodiment shown in FIG. 3, the nitride semiconductor layer 140 with high qualities is grown in the overall region using a silicon oxide film pattern having a hexagonal shape and a uniform distance, as the unit structure 133. As described above, the air gaps 132 with an empty area having a pyramidal shape are formed based on the sealing region.

Referring to FIG. 1, a number of crystal defects such as threading dislocation (represented by a plurality of vertical lines) that branch from the nitride base layer 120 are blocked by the unit structures 133. Accordingly, the unit structure 133 may serve as a mask to block crystal defects. Hereinafter, a layer including a plurality of unit structures 133 will be often referred to as a mask layer.

It can be seen that these defects may include a defect (a) that extends from the region provided between the unit structures 133 to the upper part and a defect (b) that extends such that it fills the air gap 132, but have a considerably low density, as compared to the defect of the nitride base layer 120.

Figure 4:
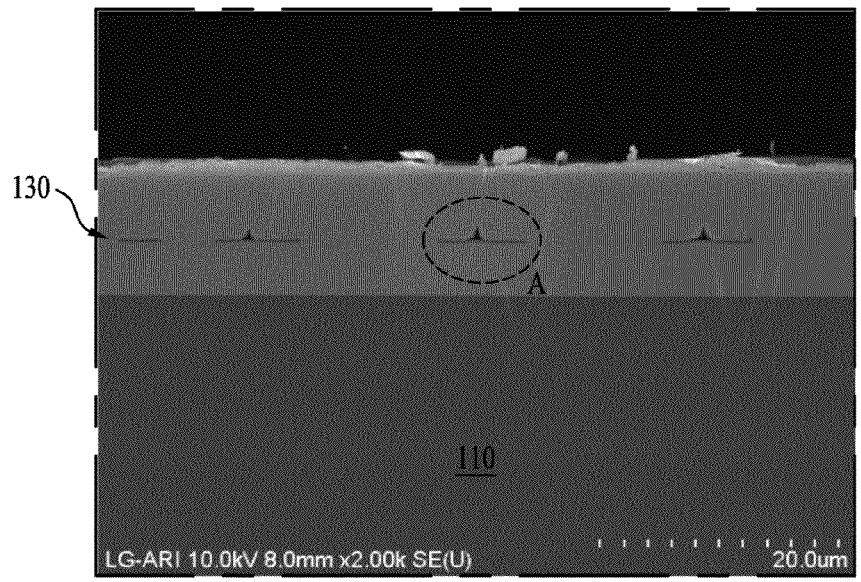
FIG. 4 is an SEM image illustrating a hetero-substrate having a thin unit structure.

FIG. 4 is an image illustrating a hetero-substrate in which the nitride semiconductor layer is grown on the base substrate 110 through the defect reduction layer 130. The image shows scanning electron microscope (SEM) observation results, which illustrates the cross-section of the hetero-substrate.

Figure 5:
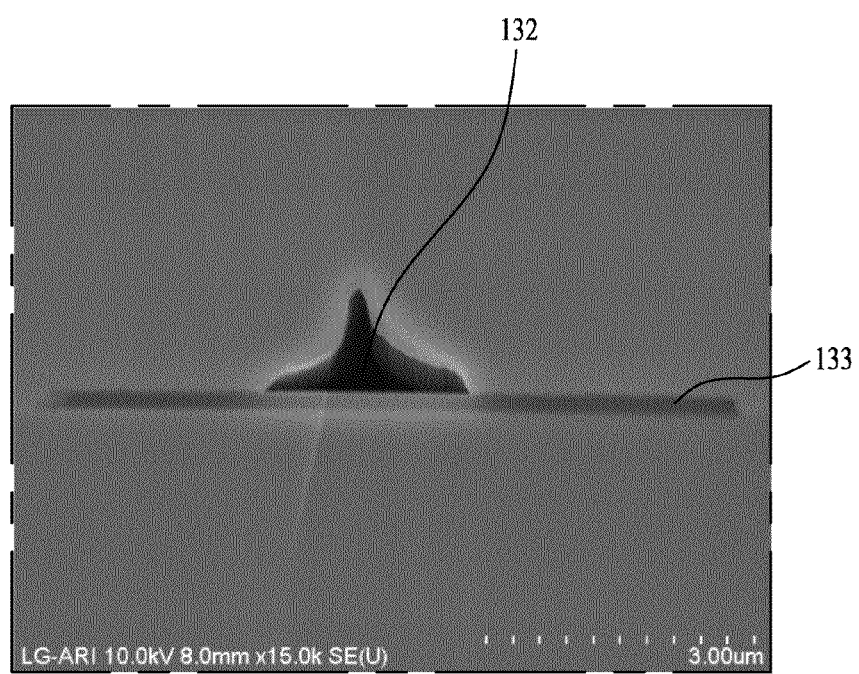
FIG. 5 is an enlarged view illustrating the part A of FIG. 4.

As can be seen from the enlarged view of FIG. 5, sealing is made by the lateral surface growth of nitride semiconductor on the unit structure 133, and the air gap 132 is thus connected to the unit structure (133; mask). The unit structure 133 has a relatively thin shape, which shows an example using a silicon oxide (SiO$_2$) with a thickness of 240 nm.

Figure 6:
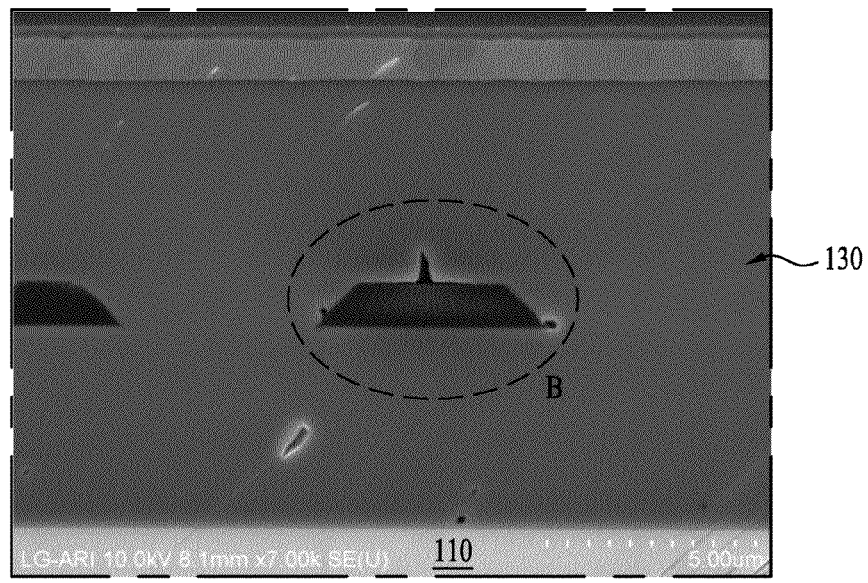
FIG. 6 is an SEM image illustrating a hetero-substrate having a thick unit structure.
Figure 7:
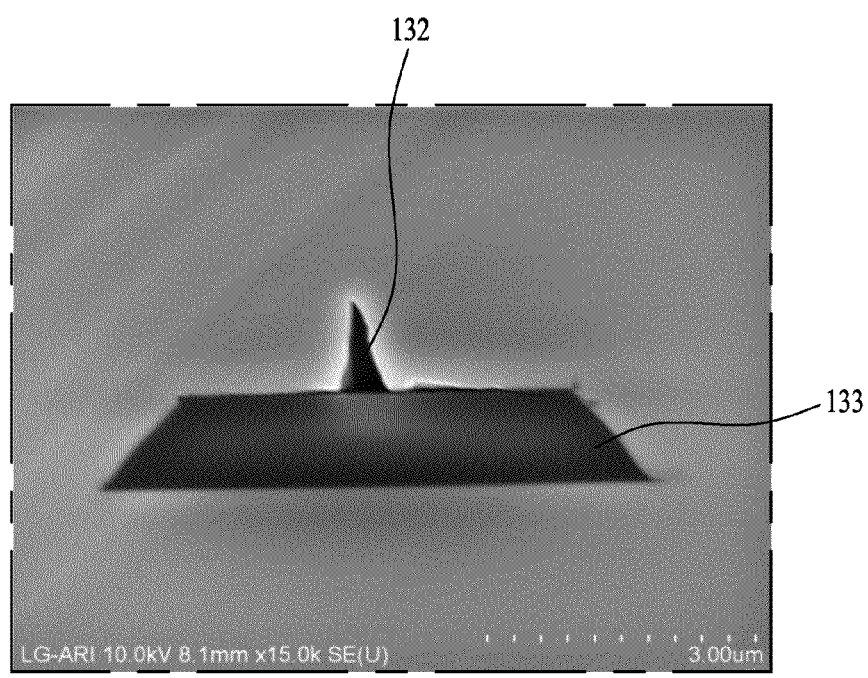
FIG. 7 is a partial enlarged view illustrating the part B of FIG. 6.

Meanwhile, although the relatively thick unit structure 133 may be used, as shown in FIG. 6, FIGS. 6 and 7 show an example in which silicon oxide with a thickness of 1 µm is used.

Figure 8:
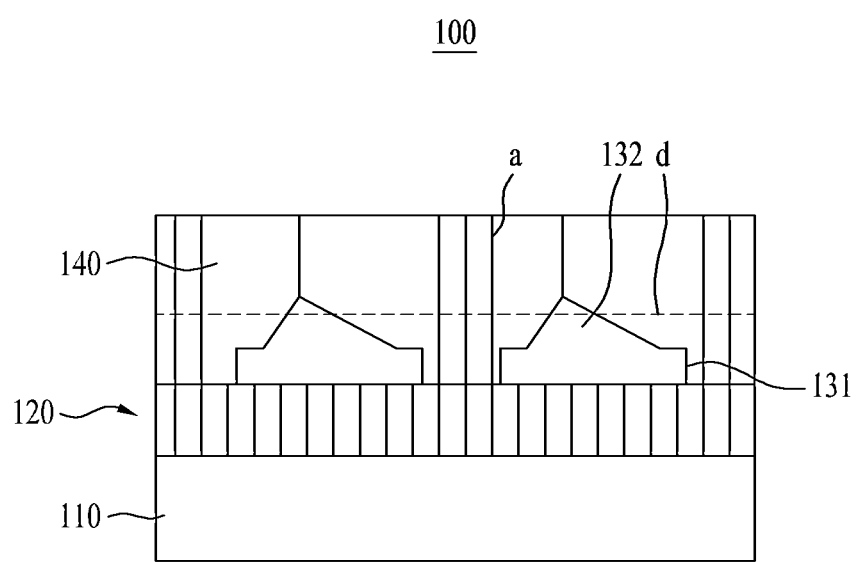
FIG. 8 is a sectional view illustrating a hetero-substrate in which a unit structure is removed.

As shown in FIG. 8, the unit structure 133 may be removed. That is, during the process of growing the nitride semiconductor layer 140 on the defect reduction layer 130 or after completion of growth of the hetero-substrate 100, the unit structure 133 may be removed.

For example, before the air gap 132 is completely filled in the process of growing the nitride semiconductor layer 140, in a case in which the layer 140 is grown into the part represented by "d", the dielectric constituting the unit structure 133 may be removed.

Through this process, the shape and size of air gap 132 can be controlled, the volume of the air gap 132 can be increased and stress between thin films can be controlled. In addition, when the air gap 132 is connected to a part of the unit structure 133 having the mask layer pattern, the mask layer may be removed even after completion of the hetero-substrate 100.

Figure 9:
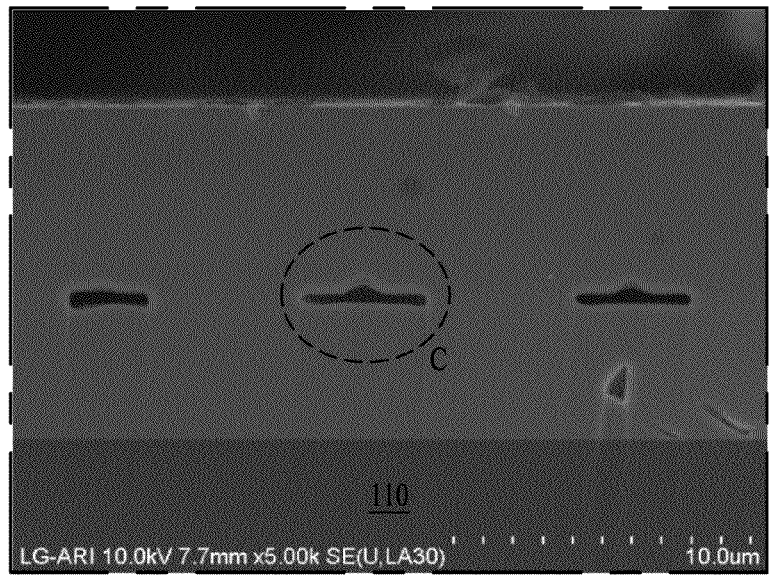
FIG. 9 is an SEM image illustrating a hetero-substrate having the structure shown in FIG. 8.
Figure 10:
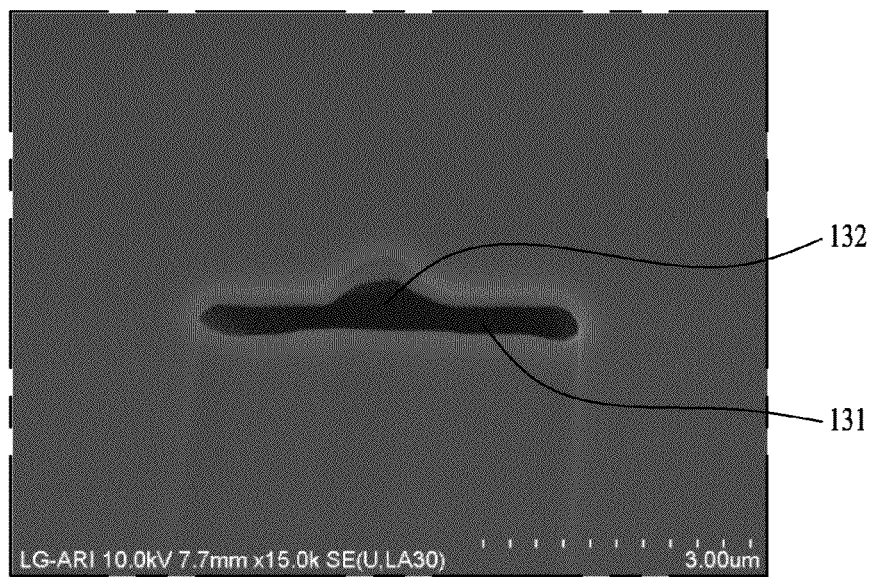
FIG. 10 is a partial enlarged view illustrating the part C of FIG. 9.

FIG. 9 shows a hetero-substrate in which the defect reduction layer 130 is grown in a state that the unit structure 133 is removed. As can be seen from the enlarged view of FIG. 10, in a state that the unit structure 133 is removed, the outline 131 constitutes a flat portion 131, the air gap 132 constitutes a protrusion 132 in the flat portion 131 and the flat portion 131 is connected to the air gap 132.

A nitride semiconductor may be partially grown inside the flat portion 131 and the internal side of the flat portion 131 may be slightly curved.

On the other hand, FIGS. 5 and 7 show a state in which the flat portion 131 is filled with a dielectric constituting the unit structure 133.

Figure 11:
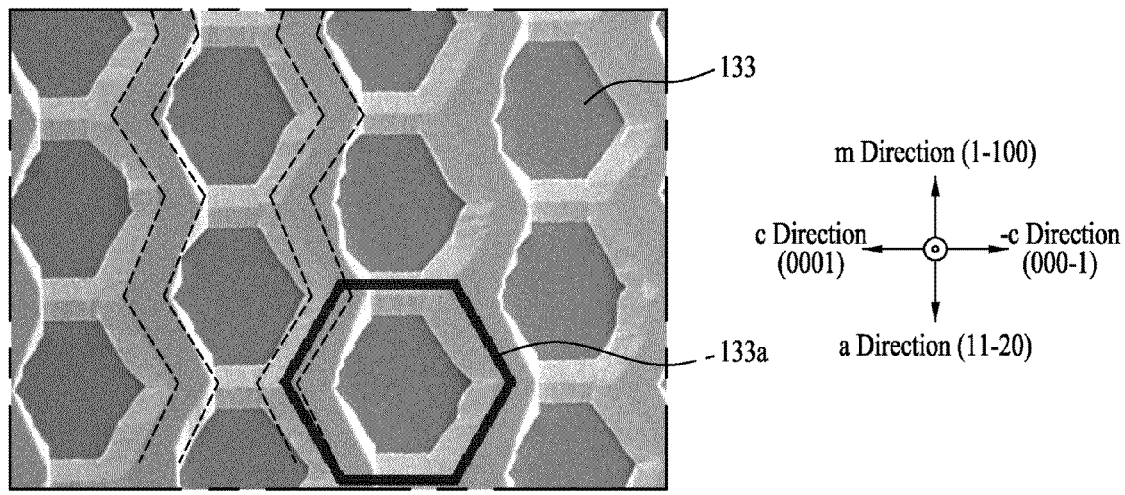
FIG. 11 and FIG. 12 are SEM images illustrating growth of the nitride semiconductor layer on a unit structure.
Figure 12:
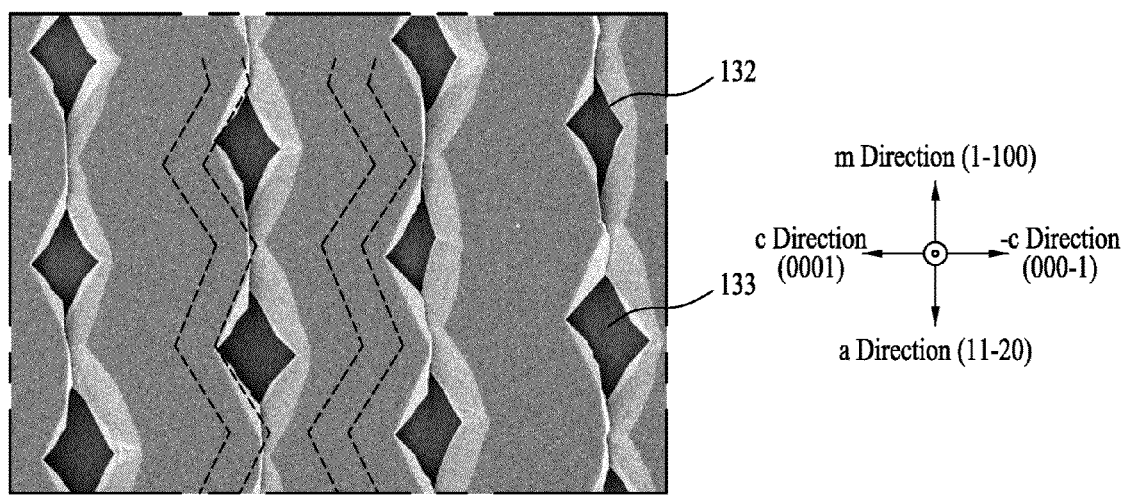

FIGS. 11 and 12 illustrate a process in which a nitride semiconductor is grown on the mask layer including the unit structure 133 used as a mask. This is an SEM image observed when the nitride semiconductor layer stops growing after formation of the unit structure 133, which clearly shows an anisotropic growth property associated with growth progress of non-polar a-surface nitride semiconductor layer.

FIG. 11 shows a state in which a nitride semiconductor is grown on an original unit structure shape 133*a* in c and −c directions and the unit structure 133 begins to be covered with the nitride semiconductor. A direction in which the growth speed in a horizontal direction is the highest is +c direction ([0001]) and −c direction ([000-1]) has a relatively low growth speed.

As a result, in a region having the smallest distance in a c direction, sealing of nitride semiconductor layers that are horizontally grown in opposite directions first occurs. Next, the nitride semiconductor layer is grown into the inside region which is the farthest from the boundary of the unit structure 133 and sealing of non-polar a-surface nitride semiconductor layer can be thus completed throughout the overall region.

Taking into consideration this fact that, in the design of the mask layer, a process of separating a partial region in an m direction to expose the nitride semiconductor layer may be required. Through the separated region, the nitride semiconductor layer may begin to be grown.

As described above, c direction growth is mostly superior to −c direction growth and the nitride semiconductor layer covers the unit structure 133, as shown FIG. 12. In this process, an air gap is formed.

FIGS. 13 to 19 illustrate various examples of disposition states of the unit structures 133 of the mask layer. As described above, it is beneficial that the width between the unit structures 133 be uniform. Accordingly, the shape of the unit structure 133 may have a triangular, tetragonal, hexagonal or arrow shape having a predetermined width.

In addition, it is beneficial that the vertex of this shape is arranged in a c or –c direction in terms of the following horizontal direction growth of the nitride semiconductor.

Figure 13:
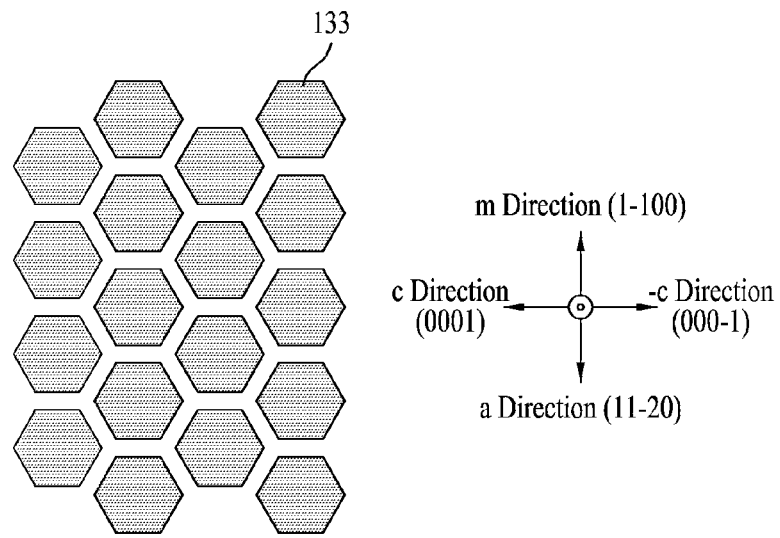
FIGS. 13 to 19 are schematic views illustrating a mask layer having unit structures with different shapes.
Figure 14:
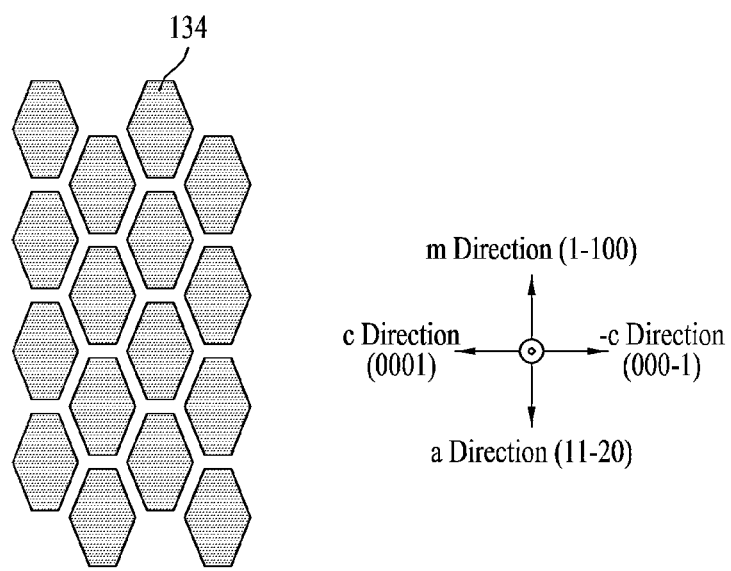
Figure 15:
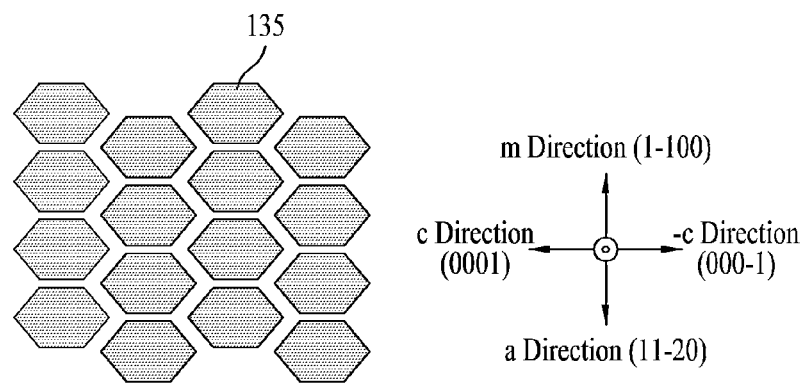

FIGS. 13 to 15 show a hexagonal mask layer. As shown in FIG. 13, the hexagonal mask layer may include an array of unit structures 133 having a regular hexagonal shape, an array of longitudinally long hexagonal unit structures 134, as shown in FIG. 14, or an array of horizontally long hexagonal unit structures 135 as shown in FIG. 15.

Figure 16:
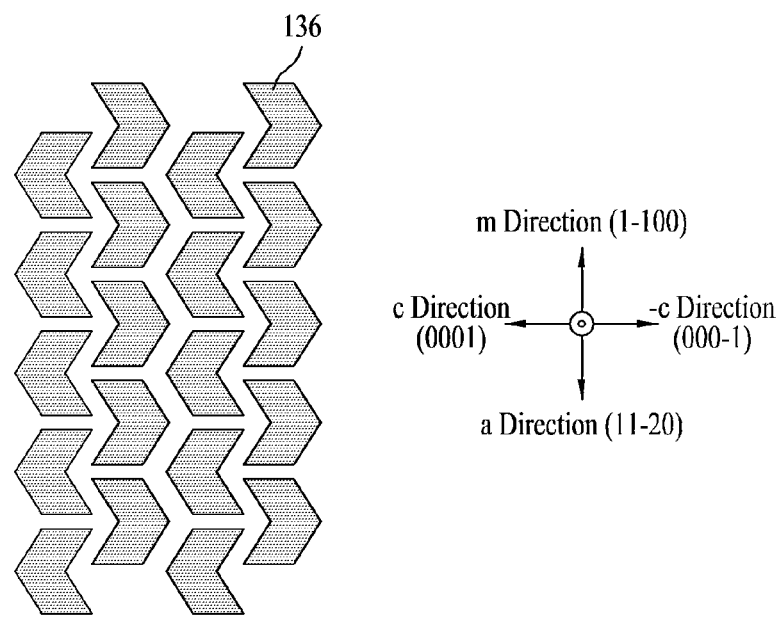
Figure 17:
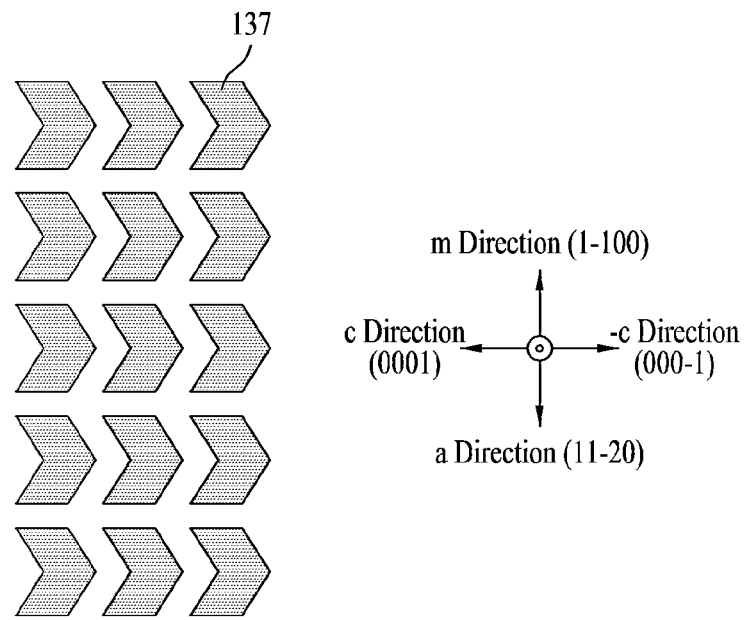

In addition, as shown in FIGS. 16 and 17, the unit structure may have an arrow shape having a predetermined width. FIG. 16 shows an example in which arrow-shaped unit structures 136 are alternately disposed, and FIG. 17 shows an example in which arrow-shaped unit structures 137 are arranged in one direction. The reason for usefulness of the array of the arrow shaped unit structures as a mask layer is that this array of the unit structures 136 and 137 makes the width between the unit structures 136 and 137 uniform.

Figure 18:
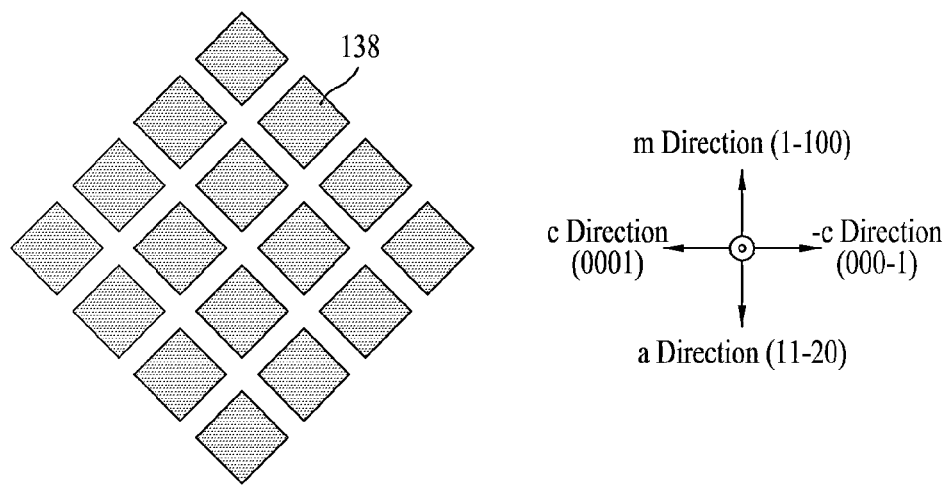
Figure 19:
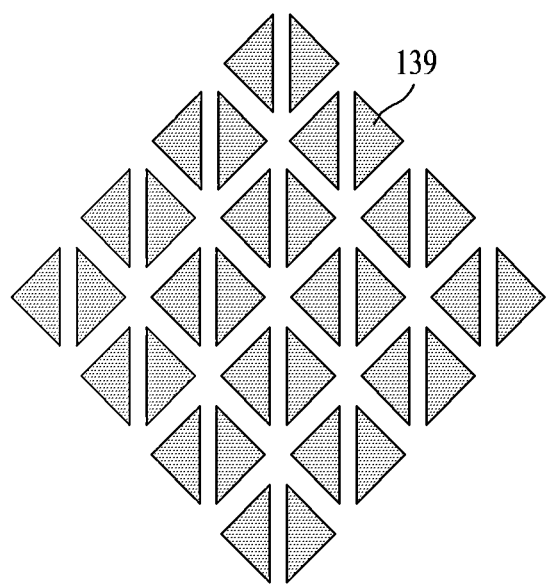
Figure 19:
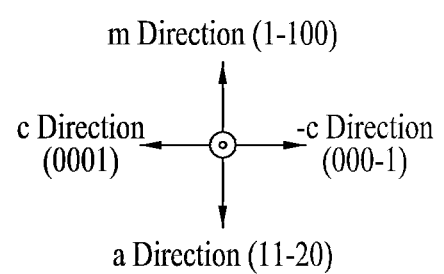

Meanwhile, the mask layer has an array of square (if necessary, rectangular) unit structures 138, as shown in FIG. 18, and has an array of triangular unit structures 139, as shown in FIG. 19.

Figure 20:
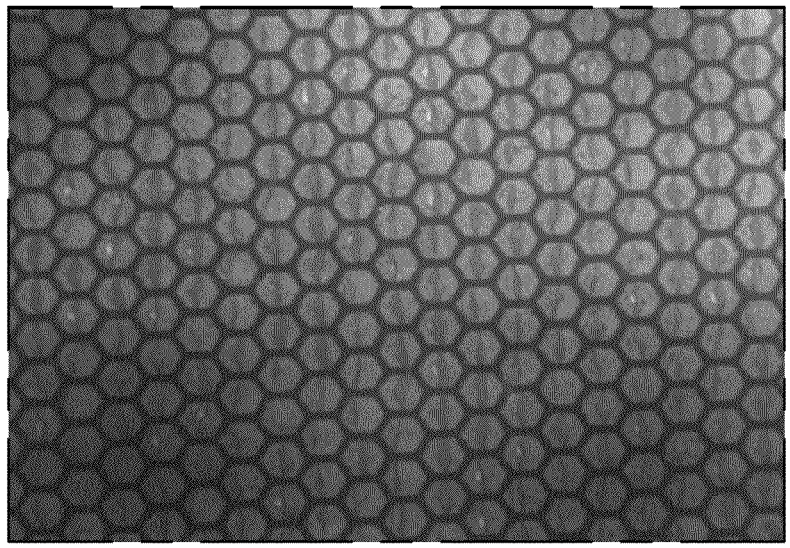
FIG. 20 is a microscopic image illustrating a hetero-substrate formed of the unit structure of FIG. 13.
Figure 21:
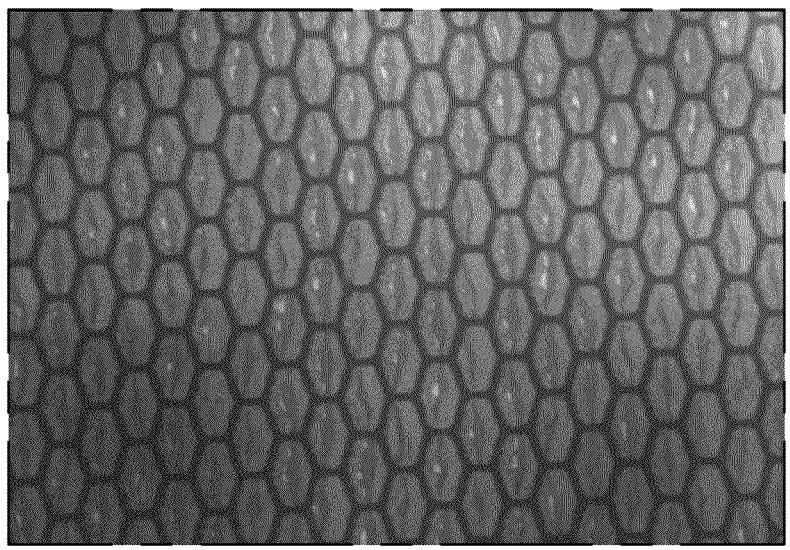
FIG. 21 is a microscopic image illustrating a hetero-substrate formed of the unit structure of FIG. 14.

FIGS. 20 and 21 are microscopic images illustrating a hetero-substrate that is actually grown through the mask layer shown in FIGS. 13 and 14.

The defect density of the hetero-substrate is determined by an area ratio (fill factor) of horizontal growth region to vertical growth region and the air gap 132 can improve light extraction characteristics. Accordingly, the shape, size and distance of the air gap 132 can be optimized according to the design of the mask layer.

Figure 22:
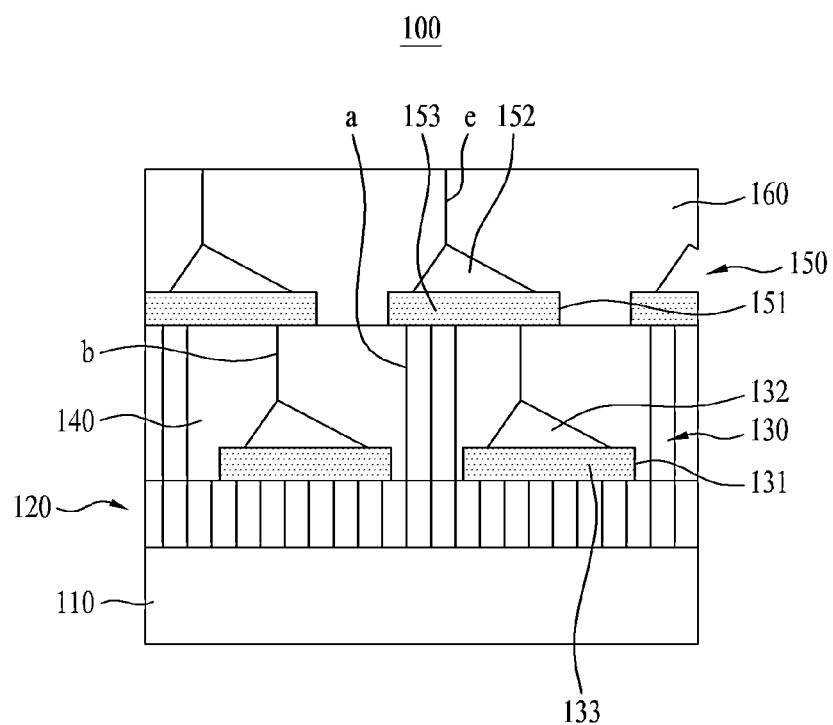
FIG. 22 is a schematic view illustrating an example of the hetero-substrate.

The defect reduction layer 130 having this mask layer may be present in plural, as shown in FIG. 22. That is, in a state that a first nitride semiconductor layer 140 is disposed on a first defect reduction layer 130, a second defect reduction layer 150 in which the unit structures 153 cross the unit structures 133 of the first defect reduction layer 130 may be provided. The defect reduction layer may be also provided in plural.

Accordingly, by providing the mask layer in which the unit structure 153 is arranged in the position capable of preventing the defect (a) propagated from the nitride base layer 120 and the defect (b) may be caused by the first defect reduction layer 130, the defects can be further reduced.

In the second defect reduction layer 150, the nitride semiconductor layer 160 is also laterally grown along the periphery surface 151 of the unit structure 153 to produce an air gap 152 and, at this time, as the defect, only the defect (e) caused by the air gap 152 remains.

Figure 23:
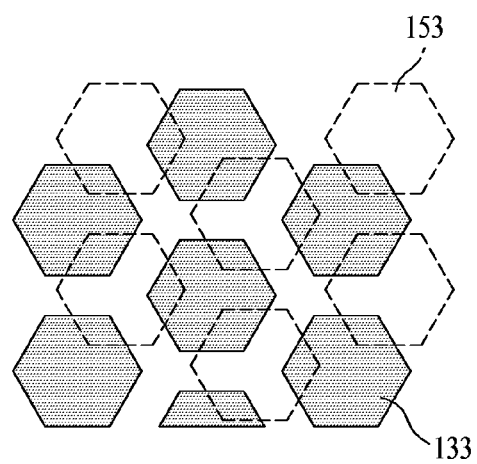
FIG. 23 is a schematic view illustrating a state in which unit structures of FIG. 22 cross.

Here, it is beneficial that the unit structure 133 of the first defect reduction layer 130 crosses the unit structure 153 of the second defect reduction layer 150 in a vertical direction, as shown in FIG. 23. That is, the center point of the unit structure 153 of the second defect reduction layer 150 may be arranged between the unit structures 133 of the first defect reduction layer 130.

Figure 24:
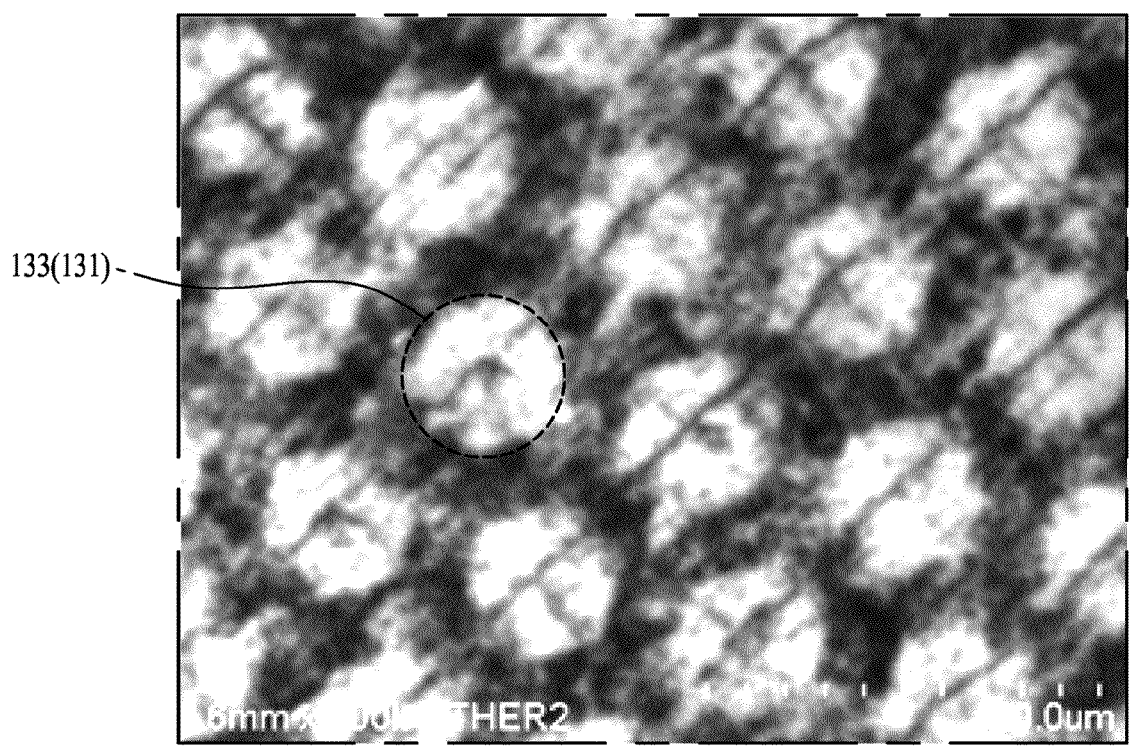
FIG. 24 is a view illustrating CL measurement results of a hetero-substrate.

FIG. 24 shows results of defect levels such as dislocation present on the surface of the hetero-substrate, measured by cathode-luminescence (CL) in a planar direction. From these CL analysis results, it can be seen that the density of defects is greatly decreased. A relatively bright region is a region 131 in which the unit structure 133 composed of a silicone oxide film is disposed or removed, which corresponds to a region in which a nitride semiconductor layer is laminated by lateral growth.

The bright region has a higher light-emitting recombination than that of neighboring regions. That is, as compared to a region in which the silicon oxide film (unit structure) is not formed, the density of defects is thought to be considerably reduced.

Figure 25:
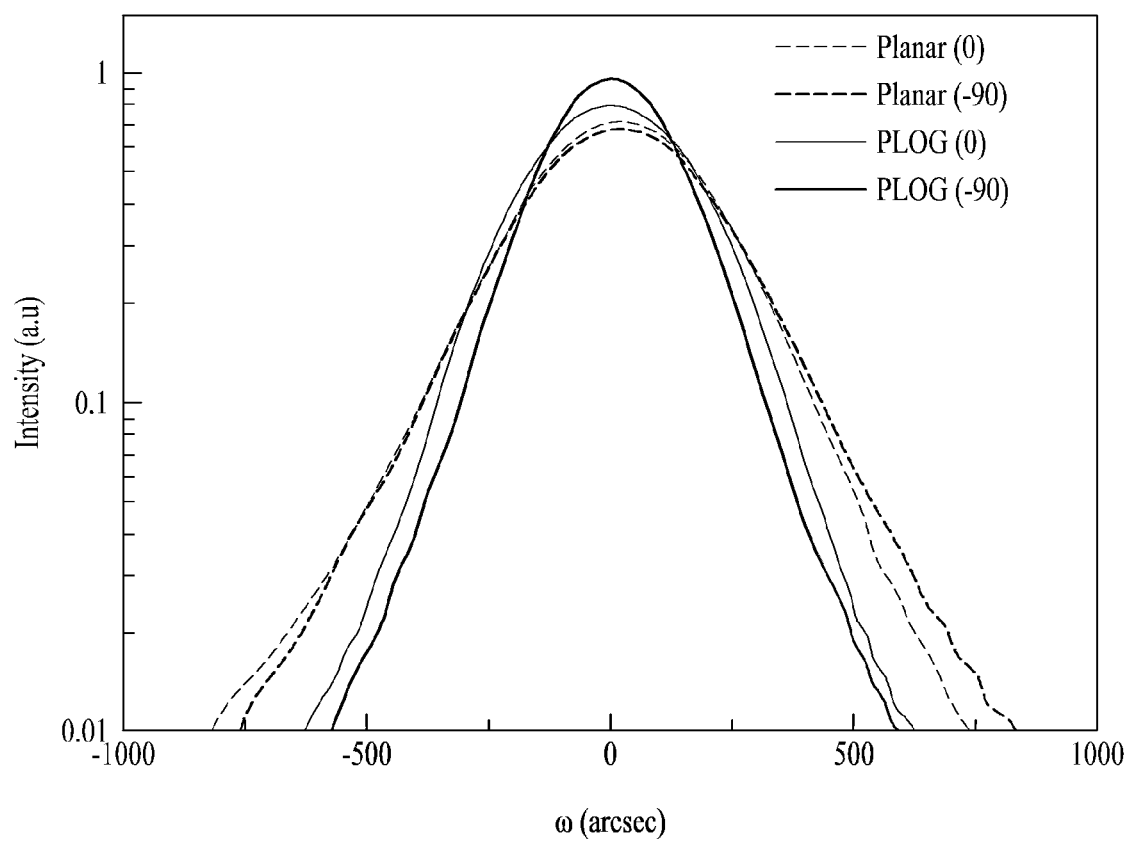
FIG. 25 is a graph showing XRC FWHM measurement results of a hetero-substrate.

FIG. 25 shows measurement results of XRC FWHM (x-ray rocking curve full-width-half-maximum) of a hetero-substrate having a common hetero-substrate and the aforementioned defect reduction layer.

From the measurement results, qualities of nitride semiconductor layer can be effectively improved through decrease of the defect density of the hetero-substrate having the defect reduction layer, and the final defect density is determined by an area ratio (fill factor) between an area of the mask layer and an area in which the nitride semiconductor layer is laminated by vertical direction growth.

Figure 26:
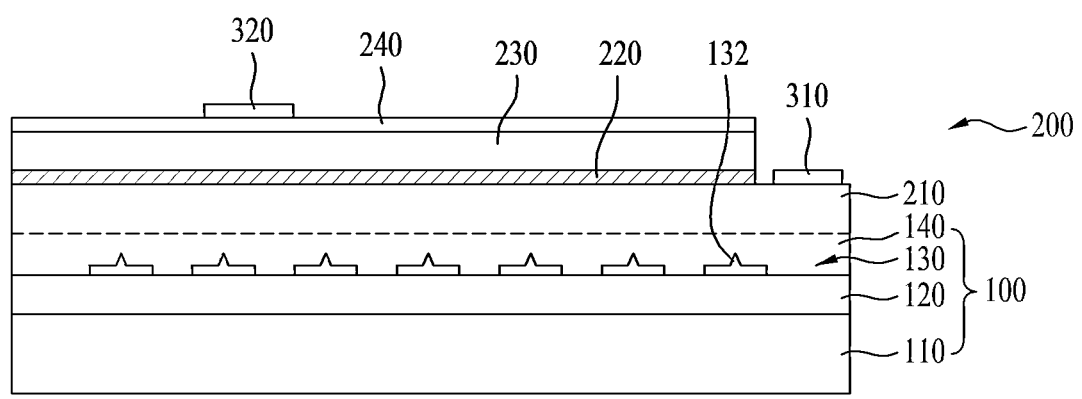
FIG. 26 is a sectional view illustrating an example of a horizontal-type light emitting diode manufactured using a hetero-substrate.

FIG. 26 shows an example in which a lateral-type nitride semiconductor light emitting device is manufactured using the aforementioned hetero-substrate 100.

That is, the lateral-type nitride semiconductor light emitting device has a structure in which a light emitting device layer 200, in which a n-type nitride semiconductor layer 210, an active layer 220 and a p-type nitride semiconductor layer 230 are laminated, is disposed on the hetero-substrate 100 and an n-type electrode 310 electrically connected to the n-type nitride semiconductor layer 210 and a p-type electrode 320 electrically connected to the p-type nitride semiconductor layer 230 are provided.

The air gap 132 disposed on the defect reduction layer 130 of the hetero-substrate 100 may serve as a light extraction structure capable of improving light extraction due to the difference in refractive index. In addition, the nitride semiconductor layer 140 may be doped with an n-type dopant.

Here, a state in which the mask layer including the unit structure is removed and only the air gap 132 remains is shown, but the unit structure may be not removed, if necessary.

Figure 27:
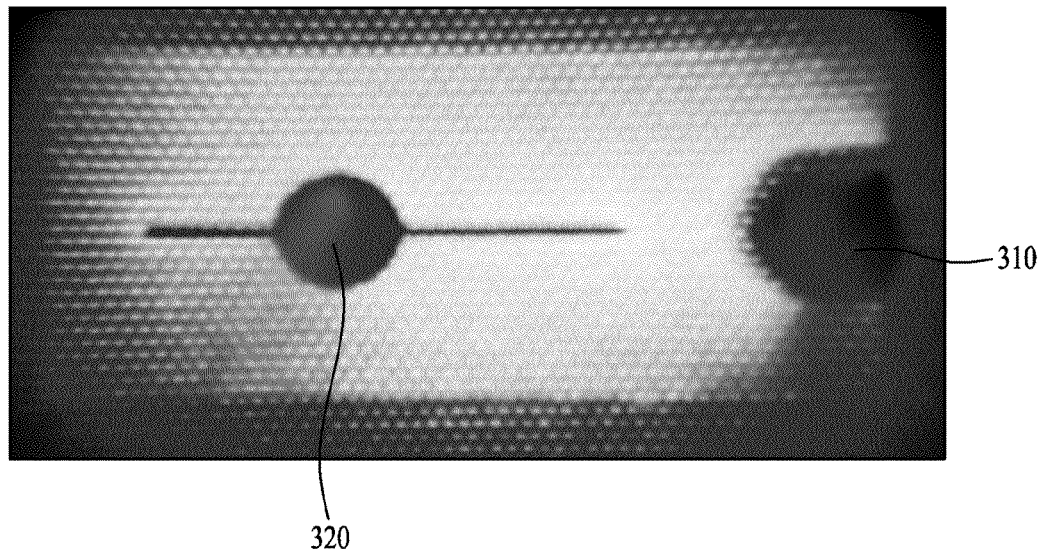
FIG. 27 is a microscopic image illustrating a horizontal-type light emitting diode.
Figure 28:
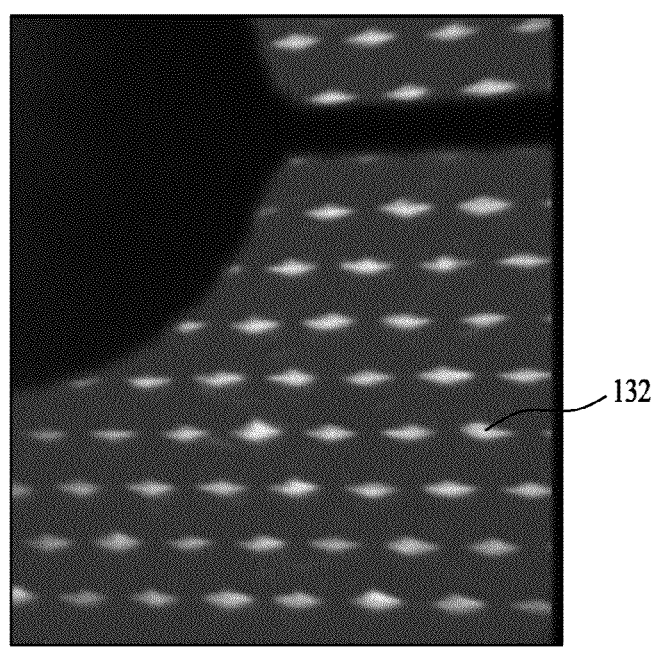
FIG. 28 is a partially enlarged microscopic image illustrating a horizontal-type light emitting diode.

FIG. 27 is a plan view illustrating a state in which the light emitting device having a structure shown in FIG. 26 operates when a current is applied thereto. FIG. 28 is an enlarged view of the p-type electrode 320. From the enlarged view, air gaps are regularly disposed. As shown in FIG. 28, more light is discharged outside through the air gap having a pyramidal shape. From the image of FIG. 28, improvement of light extraction efficiency using the structure having the air gap can be confirmed.

Figure 29:
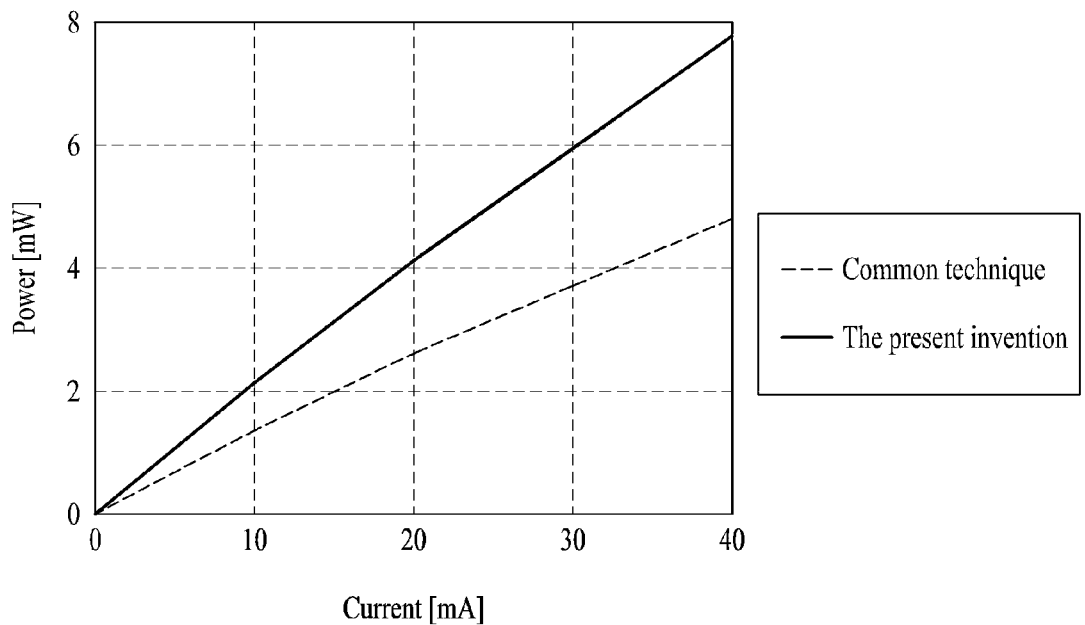
FIG. 29 is a graph showing light power improvement of a horizontal-type light emitting diode.

The improvement in light extraction efficiency leads to improvement in light output. As shown in FIG. 29, as compared to common light emitting devices, light output is greatly improved. That is, an about 57% increase in light output can be confirmed. This phenomenon is caused by decrease in defect density present on the hetero-substrate and improvement in light extraction efficiency based on the air gap.

A vertical-type light emitting device may be manufactured using the aforementioned hetero-substrate.

A high power light emitting diode may have a structure in which only a nitride semiconductor layer is configured without a sapphire base substrate. This aims to improve heat discharge property and light extraction efficiency.

Figure 30:
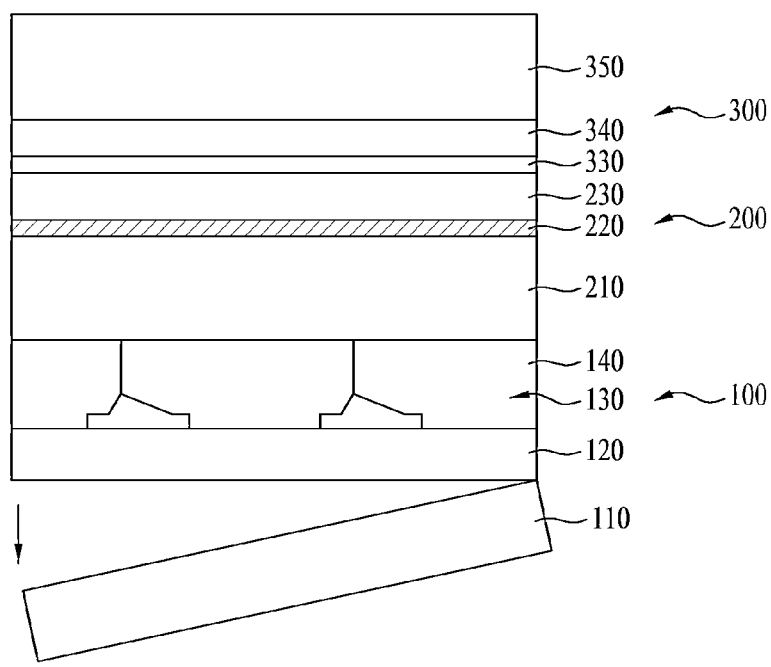
FIG. 30 is a sectional view illustrating a process for manufacturing a vertical-type light emitting diode.

That is, as shown in FIG. 30, a light emitting device layer 200 in which a n-type nitride semiconductor layer 210, an active layer 220, and a p-type nitride semiconductor layer 230 are laminated is disposed on the hetero-substrate 100, and a p-type electrode 330 that can serve as a reflection electrode and a support structure 300 including the support layer 350 is provided on the light emitting device layer 200.

In addition, the bonding metal layer 340 may be disposed between the p-type electrode 330 and the support layer 350. The base substrate 110 of the hetero-substrate 100 supported by the support layer 350 can be separated by a process such as laser lift-off or chemical lift-off.

Figure 31:
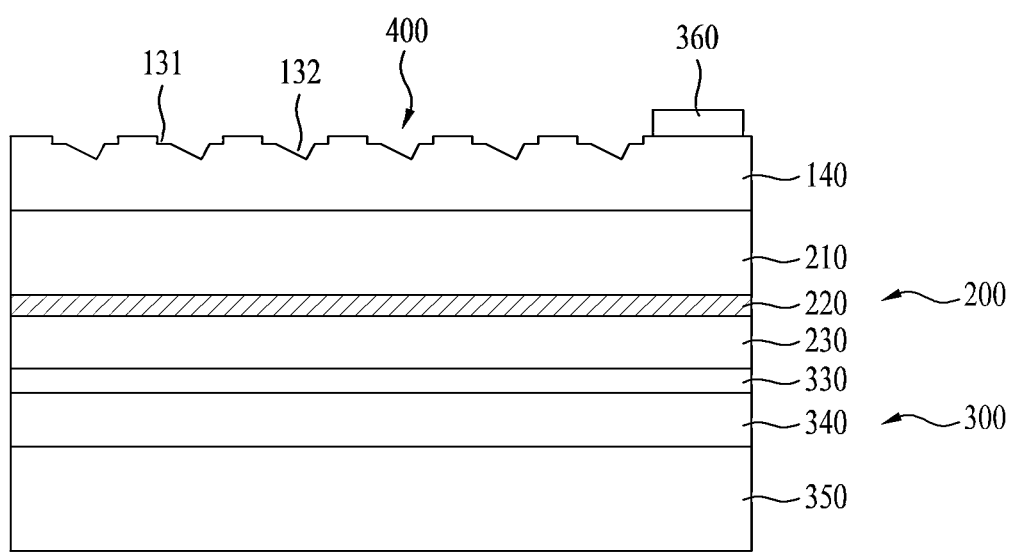
FIG. 31 is a sectional view illustrating an example of a vertical-type light emitting diode.

Next, when the nitride base layer 120 is removed, the air gap 132 is exposed. When an n-type electrode 360 is formed on the surface where the nitride base layer 120 is removed, the state shown in FIG. 31 is obtained. That is, after removal of the nitride base layer 120, light extraction efficiency can be improved through the roughness of the air gap 132 without additional surface treatment and the photoelectric efficiency of the light emitting diode can be thus improved.

From FIG. 31, it can be seen that the light extraction structure 400 in which the outline 131 and the air gap 132 are regularly disposed on the light emission surface can be obtained by removing the unit structure.

The n-type electrode 360 may be formed in a region in which the light extraction structure 400 is not disposed, or may be disposed on the light extraction structure 400, if necessary.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A non-polar hetero substrate, comprising:
   a non-polar base substrate comprising r-surface sapphire;
   a nitride base layer disposed on the substrate;
   a first defect reduction layer disposed on the nitride base layer, the first defect reduction layer including a plurality of air gaps and a plurality of flat portions, wherein each of the plurality of flat portions has a hexagonal void form and is connected to a corresponding one of the plurality of air gaps, and wherein the plurality of air gaps are uniformly arranged at a predetermined interval so as to form a light extraction structure, and wherein each of the plurality of air gaps has a substantially asymmetric form having an elongated portion parallel to the flat portion and a protrusion around a center portion of each of the plurality of air gaps; and
   a nitride semiconductor layer disposed on the first defect reduction layer.

2. The non-polar hetero substrate according to claim 1, wherein a width between adjacent flat portions of the plurality of flat portions is substantially uniform.

3. The non-polar hetero substrate according to claim 1, wherein a vertex of each of the plurality of flat portions is arranged in a c direction of the nitride semiconductor layer.

4. The non-polar hetero substrate according to claim 1, further comprising a second defect reduction layer provided on the nitride semiconductor layer, the second defect reduction layer including a plurality of air gaps.

5. A non-polar nitride-based light emitting device, comprising:
   a defect reduction layer including a plurality of air gaps and a plurality of flat portions, wherein each flat portion has a hexagonal void form connected to a corresponding one of the plurality of air gaps, wherein the plurality of air gaps are uniformly arranged at a predetermined interval so as to form a light extraction structure, and wherein each of the plurality of air gaps has a substantially asymmetric form having an elongated portion parallel to the flat portion and a protrusion around a center portion of each of the plurality of air gaps;
   a first conductive semiconductor layer disposed on the defect reduction layer;
   an active layer disposed on the first conductive semiconductor layer;
   a second conductive semiconductor layer disposed on the active layer;
   a first electrode electrically connected to the first conductive semiconductor layer; and
   a second electrode electrically connected to the second conductive semiconductor layer.

6. The non-polar nitride-based light emitting device according to claim 5, wherein the defect reduction layer comprises:
   a non-polar base substrate comprising r-surface sapphire;
   a nitride base layer disposed on the substrate; and
   a nitride semiconductor layer disposed on the nitride base layer.

7. The non-polar nitride-based light emitting device according to claim 6, wherein the defect reduction layer is disposed between the nitride base layer and the nitride semiconductor layer.

8. The non-polar hetero substrate according to claim 1, wherein peripheries of each flat portion and the corresponding air gap are continuously connected.

9. The non-polar nitride-based light emitting device according to claim 5, wherein peripheries of each flat portion and the corresponding air gap are continuously connected.

10. The non-polar nitride-based light emitting device according to claim 9, wherein the periphery of each flat portion and the corresponding air gap are arranged at an outer surface of the first conductive semiconductor layer.

* * * * *